United States Patent

Tani et al.

Patent Number: 5,985,461
Date of Patent: Nov. 16, 1999

[54] ELECTROCONDUCTIVE PASTE, AND METHOD FOR PRODUCING CERAMIC SUBSTRATE USING IT

[75] Inventors: Hiroji Tani, Nagaokakyo; Kazuhito Ohshita, Omihachiman, both of Japan

[73] Assignee: Murata Manufacturing Co., Ltd., Japan

[21] Appl. No.: 08/971,496

[22] Filed: Nov. 17, 1997

[30] Foreign Application Priority Data

Dec. 4, 1996 [JP] Japan ................................. 8-340592

[51] Int. Cl.$^6$ .............................. B32B 15/00; B05B 3/10; C03B 29/00; H01B 1/02
[52] U.S. Cl. ......................... 428/433; 428/323; 428/689; 252/512; 156/89.18; 106/1.18
[58] Field of Search .................................. 428/433, 209, 428/432, 323, 327, 901, 689; 156/89.18, 89.16, 89.11; 252/512; 106/1.13, 1.18

[56] References Cited

U.S. PATENT DOCUMENTS

| | | | |
|---|---|---|---|
| 4,789,411 | 12/1988 | Eguchi et al. | 148/24 |
| 4,894,184 | 1/1990 | Fukuoka et al. | 252/512 |
| 5,035,837 | 7/1991 | Saeki et al. | 252/512 |
| 5,336,301 | 8/1994 | Tani et al. | 106/1.18 |
| 5,618,470 | 4/1997 | Yamana et al. | 252/512 |
| 5,807,508 | 9/1998 | Kawahara et al. | 252/512 |
| 5,840,432 | 11/1998 | Hirai et al. | 428/580 |

FOREIGN PATENT DOCUMENTS

| | | |
|---|---|---|
| 3-239767 | 10/1991 | Japan . |
| 4-308605 | 10/1992 | Japan . |

*Primary Examiner*—Timothy Speer
*Assistant Examiner*—Stephen Stein
*Attorney, Agent, or Firm*—Ostrolenk, Faber, Gerb & Soffen, LLP

[57] ABSTRACT

Provided is an electroconductive paste for forming via-holes through ceramic substrates, and a method for producing ceramic substrates using the paste. The via-holes formed with the paste crack little during baking, and have high electric reliability and good solderability and platability. The paste comprises from about 80 to 93% by weight of a spherical or granular electroconductive metal powder having a grain size range of between about 0.1 and 50 μm, from about 2 to 10% by weight of an insoluble resin powder having a grain size range of between about 0.1 and 50 μm, and from about 5 to 18% by weight of an organic vehicle. The via-holes 2 formed through a ceramic green sheet 1 are filled with the paste 1, and a plurality of those ceramic green sheets 1 are laminated under heat and baked under a predetermined condition to produce a multi-layered ceramic substrate 6.

12 Claims, 1 Drawing Sheet

ELECTROCONDUCTIVE PASTE, AND METHOD FOR PRODUCING CERAMIC SUBSTRATE USING IT

FIELD OF THE INVENTION

The present invention relates to an electroconductive paste and a ceramic substrate comprising it. More precisely, it relates to an electroconductive paste to be used in forming a via-hole in a ceramic substrate, and to a ceramic substrate as formed using the paste.

BACKGROUND OF THE INVENTION

Ceramic substrates with good mechanical and electric characteristics are used in a variety of recent electronic parts. For those, multi-layered ceramic substrates, which comprise a plurality of ceramic sheets with electrodes and circuit patterns mounted thereon and in which the inner electrodes and circuit patterns are connected with each other via holes formed through the ceramic sheets, are widely used in order to increase packaging density.

One conventional method for producing such multi-layered ceramic substrates having inner electrodes and circuit patterns connected with each other by via holes comprises the following steps (1) to (4):

(1) First, holes for "via-holes" are formed through ceramic green sheets, using a drill or punch.

(2) Next, the thus-formed holes are filled with an electroconductive paste or metal powder.

(3) Next, an electroconductive paste is applied over the surface of each ceramic green sheet through screen printing or the like, to thereby form an electrode and/or a circuit pattern thereon.

(4) Last, a plurality of those ceramic green sheets are laminated under pressure, cut into predetermined sizes, and baked, whereby the ceramic green sheets are sintered while the electroconductive paste or metal powder existing in the via-holes is also sintered, and hence the inner circuit patterns are electrically connected with each other.

In that conventional method, copper is popularly used as the electroconductive material for forming the via-holes, since it has a small specific resistivity, it hardly migrates through the laminated sheets and it is inexpensive. For example, generally used therein is an electroconductive paste prepared by mixing and dispersing copper powder in an organic vehicle comprising a resinous component such as ethyl cellulose. As in the above, the ceramic green sheets and the metal existing in the via-holes are simultaneously baked in the baking step in the conventional method. In this method, therefore, any short or excessive filling of the electroconductive paste into the via-holes and any difference in the degree of contraction between the electroconductive paste and the ceramic green sheets being baked simultaneously will produce cracks of the electroconductive metal (formed as a result of sintering of the electroconductive metal powder in the paste) in the via-holes and/or cracks of the baked ceramic sheets themselves. Those cracks of the electroconductive metal in the via-holes and the ceramic sheets cause the via-holes to fail to have good electroconductivity and make the resulting ceramic laminate substrate have structural defects, resulting in that the reliability of the ceramic laminate sheet is lowered.

SUMMARY OF THE INVENTION

The present invention is to solve the above-mentioned problems with the conventional method, and its object is to provide an electroconductive paste which is used in forming via-holes in ceramic substrates, which is hardly cracked when baked, which realizes high electric reliability, and which has good solderability and platability, and also to provide a method for producing ceramic substrates using the paste.

The invention provides an electroconductive paste to be used in forming via-holes in ceramic substrates, comprising from about 80 to 93% by weight, preferably about 85–90%, of an electroconductive metal powder having spherical or granular shape and a grain size range between about 0.1 and 50 $\mu$m, preferably about 0.1–30 $\mu$m, from about 2 to 10% by weight, preferably about 2–8 % of an insoluble resin powder having a grain size range between about 0.1 and 50 $\mu$m, preferably about 0.1–30 $\mu$m, and from 5 to 18% by weight, preferably about 7–13%, of an organic vehicle.

The paste of the invention can be favorably filled into via-holes in ceramic substrates. In addition, the insoluble resin powder retards the contraction of the electroconductive metal in the paste being baked, thereby inhibiting the baked electroconductive metal (formed as a result of sintering of the electroconductive metal powder in the paste) from being cracked. Moreover, being decomposed and lost in the baking step, the insoluble resin powder does not interfere with the solderability and the platability of the via-holes formed. Using the paste of the invention, therefore, formed are via-holes with good solderability and platability.

The "insoluble resin powder" in the electroconductive paste of the invention is a resin that does not dissolve in the components constituting the paste (that is generally, not in the solvent constituting the organic vehicle in the paste).

The "via-holes" referred to herein shall broadly include not only so-called via-holes in the narrow sense of the word, which are to connect inner electrodes and inner circuits with each other, but also even through-holes which are made to pass through ceramic substrates.

The electroconductive paste of the invention contains a spherical or granular electroconductive metal powder. As a result, the paste containing the powder can be filled into the via-holes to a high degree. The electroconductive metal powder in the paste has a grain size range falling between about 0.1 and 50 $\mu$m. If the grain size of the powder is smaller than 0.1 $\mu$m, the viscosity of the electroconductive paste containing the powder is increased. If so, and if a base metal powder is used as the electroconductive metal powder, the surface of the metal powder is oxidized, resulting in the electroconductivity-resistance characteristic of the metal in the via-holes is worsened. On the other hand, if the grain size of the metal powder is larger than 50 $\mu$m, the paste containing the powder is not suitable for screen printing.

The electroconductive metal powder content of the paste of the invention is between about 80 and 93% by weight. This is because if its content is smaller than 80% by weight, the density of the paste filled in via-holes is low, but if larger than 93% by weight, the paste is difficult to produce since the solid content is too large.

The insoluble resin powder in the paste of the invention has a grain size range falling between about 0.1 and 50 $\mu$m. This is because if the grain size of the powder is smaller than 0.1 $\mu$m, the viscosity of the electroconductive paste containing the powder is increased. On the other hand, if the grain size of the resin powder is larger than 50 $\mu$m, the paste containing the powder is not suitable for screen printing. From the viewpoint of improving the fillability of the paste, it is desirable that the insoluble resin powder is of spherical or granular grains, like the electroconductive metal powder.

However, since the resin content of the paste of the invention is relatively small, the resin powder may also be of flakes.

The insoluble resin powder content of the paste of the invention is between about 2 and 10% by weight. This is because if its content is smaller than 2% by weight, the baked metal in the via-holes is cracked, but if larger than 10% a by weight, many pores are formed in the via-holes, resulting in that the conductivity-resistance characteristic of the metal in the via-holes is worsened and the solderability and platability of the ceramic substrates is poor.

The electroconductive paste of the invention comprises an organic vehicle, which may be any of the organic vehicles that is generally used for forming thick films. Any suitable organic vehicle can be employed in the invention, depending on the combination of the binder to be in ceramic green sheets and the organic vehicle. One preferred example of the organic vehicle is a solution of an organic binder, ethyl cellulose resin dissolved in a terpineol-type solvent.

In the electroconductive paste of the invention, the electroconductive metal powder is preferably copper powder.

Where copper powder, which has a relatively small specific resistivity, migrates little and is inexpensive, is used as the electroconductive metal powder in the paste, the invention is economical and is especially advantageous in forming via-holes with good electric reliability.

Also preferably, the insoluble resin powder in the paste is crystalline cellulose powder. Where crystalline cellulose powder is used as the insoluble resin powder in the paste, the invention is more effective to be sure to produce ceramic substrates with better via-holes.

The invention also provides a method for producing ceramic substrates, comprising the steps of 1) forming a hole for a via-hole through a ceramic green sheet, 2) filling the hole with an electroconductive, 3) laminating a plurality of said ceramic green sheets to give a laminate and 4) baking the resulting laminate, wherein the electroconductive paste is the above described eLectroconductive paste.

According to the method, a plurality of ceramic green sheets, of which the via-holes have been filled with the electroconductive paste of the invention, are laminated, and the resulting laminate is baked, whereupon the paste acts in the manner mentioned above and ceramic substrates are produced efficiently, and the via-holes have good solderability and platability and high electric reliability.

The invention is will become apparent from the following description of the invention which refers to the accompanying drawings.

PREFERRED EMBODIMENTS OF THE INVENTION

Formation of Ceramic Green Sheets:

As the ceramic material, prepared was a powder of a $BaO-Al_2O_3-SiO_2$ glass composite material. To this powder were added an organic binder, polyvinyl butyral, and an organic solvent, toluene, and the combination kneaded to prepare a raw material slurry.

Next, the slurry was sheeted into ceramic green sheets by the doctor blade method. These sheets were punched to form via-holes therethrough.

Preparation of Electroconductive Pastes:

In this embodiment, spherical copper grain powder was used as the electroconductive metal powder, and crystalline cellulose powder was used as the insoluble resin powder. As the organic vehicle, used was a solution as prepared by dissolving an organic binder, ethyl cellulose resin, in a terpineol-type solvent.

Those raw materials were formulated in a varying ratio mentioned below, and kneaded to give electroconductive pastes for forming via-holes.

(1) Electroconductive Metal Powder (spherical copper powder):

Grain Size Range: 0.1 to 50 μm

Amount: 75 to 94% by weight (2) Insoluble Resin (crystalline cellulose):

Grain Size Range: 0.1 to 50 μm

Amount: 0 to 15% by weight (3) Organic Vehicle:

Amount: 4 to 18% by weight

Table 1 below shows the compositions of the thus-prepared electroconductive pastes, in which the samples marked with asterisk (*) are comparative samples not falling within the scope of the invention.

TABLE 1

| | Composition of Electroconductive Paste | | | Test Results | | | | |
|---|---|---|---|---|---|---|---|---|
| | | Insoluble | | | | | | |
| Sample No. | Copper Powder (wt. %) | Resin Powder (wt. %) | Organic Vehicle (wt. %) | Cracks of Metal in Via-holes | Swelling of Metal in Via-holes | Cracks in Ceramic Sheets | Platability | Solderability |
| 1* | 85 | 0 | 15 | yes | no | no | A | A |
| 2* | 85 | 1 | 14 | yes | no | no | A | A |
| 3 | 80 | 2 | 18 | no | no | no | A | A |
| 4 | 85 | 5 | 10 | no | no | no | A | A |
| 5 | 93 | 2 | 5 | no | no | no | A | A |
| 6 | 90 | 5 | 5 | no | no | no | A | A |
| 7 | 80 | 10 | 10 | no | no | no | A | A |
| 8* | 80 | 15 | 5 | yes | yes | no | C | C |

TABLE 1-continued

| | Composition of Electroconductive Paste | | | Test Results | | | | |
|---|---|---|---|---|---|---|---|---|
| | | Insoluble | | | | | | |
| Sample No. | Copper Powder (wt. %) | Resin Powder (wt. %) | Organic Vehicle (wt. %) | Cracks of Metal in Via-holes | Swelling of Metal in Via-holes | Cracks in Ceramic Sheets | Platability | Solder- ability |
| 9* | 94 | 2 | 4 | (with pores) | Unpasted | | | |
| 10* | 75 | 10 | 15 | yes (with poor filling) | no | no | B | B |

A: good
B: fair
C: poor

Figure 1:
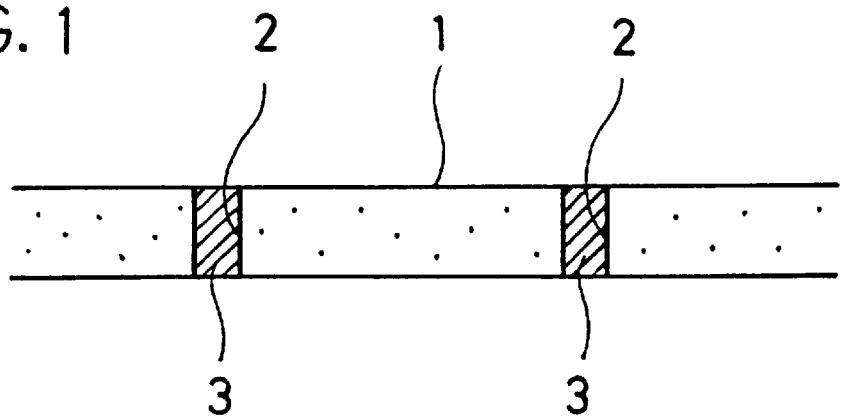
FIG. 1 is a cross-sectional view graphically showing one embodiment of the invention in which the via-holes formed in a ceramic green sheet have been filled with an electroconductive paste through screen printing.
Figure 2:
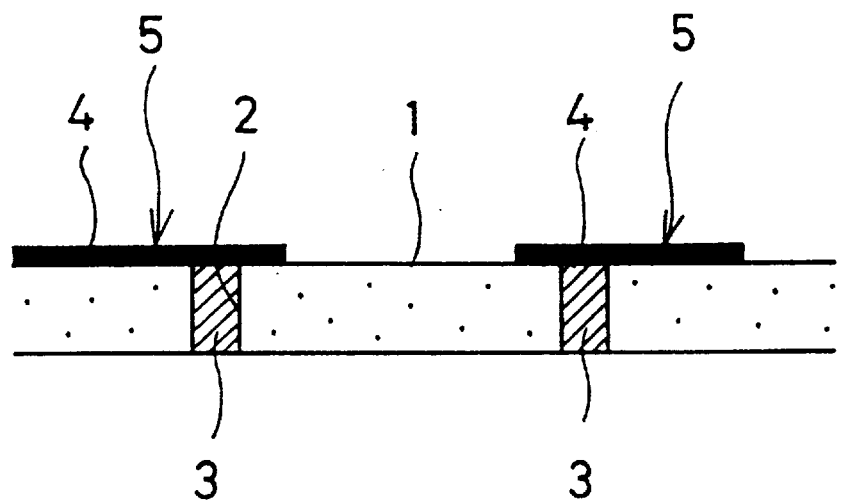
FIG. 2 is a cross-sectional view graphically showing the embodiment of the invention in which an electroconductive paste for circuit patterns has been printed on the ceramic green sheet.

Formation of Ceramic Substrates:

As in FIG. 1, the via-holes 2 formed through a ceramic green sheet 1 were filled with the electroconductive paste 3 by a screen printing method, and then dried. Next, as in FIG. 2, an electroconductive paste 4 for circuit patterns was printed on the ceramic green sheet 1 to form the circuit patterns 5 thereon.

Figure 3:
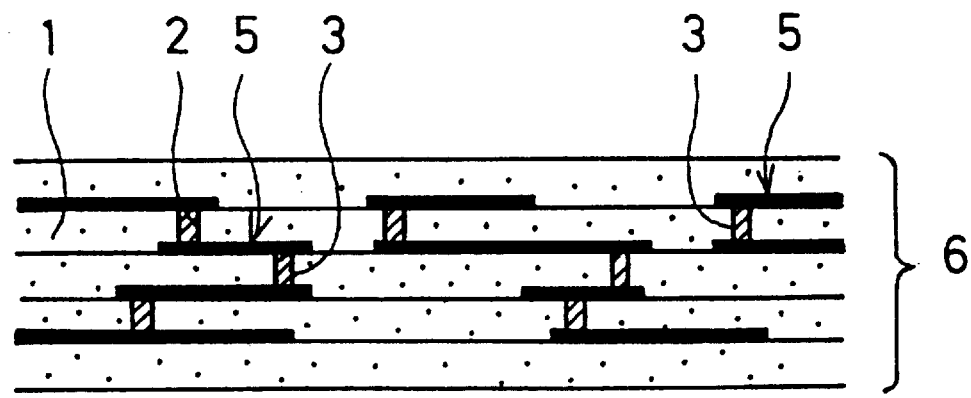
FIG. 3 is a cross-sectional view graphically showing the embodiment of the invention in which a plurality of ceramic green sheets have been laminated to give a laminate.

Next, as in FIG. 3, a plurality of those ceramic green sheets 1 having the predetermined circuit patterns formed thereon were laminated under pressure to produce a laminate 6. The resulting laminate 6 was cut into a predetermined size, and baked in a nitrogen atmosphere at 1000° C. for 1 to 2 hours to obtain a multi-layered ceramic substrate. In this embodiment, the laminate 6 was cut at a predetermined position and then baked, but, if desired, the cutting step may be omitted. Needless-to-say, the embodiment comprising the cutting step and the embodiment not comprising it are both within the scope of the invention.

Next, the multi-layered ceramic substrate was degreased with a solvent to remove the oily component and a film formed through oxidation from the surface of the conductor, then activated with a Pd-containing solution, and thereafter non-electrolytically plated with Ni.

Evaluation of the Characteristics of Multi-layered Ceramic Substrates:

The thus-obtained, multi-layered ceramic substrates were cut, and the cross-sectional surface of each piece was observed with a stereoscopic microscope to check the presence or absence of cracks of the electroconductive metal (that is, the sintered copper formed as a result of the baking of the electroconductive paste) in the via-holes, the presence or absence of swollen surfaces of the via-holes, and the presence or absence of cracks of the ceramic substrate itself.

In addition, the surface of the Ni plate formed over the surface of the via-holes filled with the electroconductive metal was observed by SEM (scanning electron microscope) whereby the platability of the via-holes was evaluated. Then the metal in the via-holes was soldered to evaluate its solderability. The data obtained in those tests are shown in Table 1 above.

Table 1 shows that sample No. 9, in which the copper powder content was above the defined range, could not be pasted. Sample No. 10, where the copper powder content was below the defined range, could not be filled satisfactorily into the via-holes, resulting in the electroconductive metal formed in the via-holes being cracked. In addition, the platability and the solderability of those samples Nos. 9 and 10 were fair.

Regarding the insoluble resin powder, samples Nos. 1 and 2, in which the insoluble resin powder content was below the defined range, were defective in that the electroconductive metal in the via-holes was cracked.

On the other hand, sample No. 8, where the insoluble resin powder content was above the defined range, was also defective in that the electroconductive metal in the via-holes had pores and that its platability and solderability was poor.

In sample No. 9, in which the copper powder content was above the defined range but the amount of the organic vehicle was below the defined range, could not be pasted and could not be tested for its characteristics.

As opposed to those comparative samples, the samples of the invention (Nos. 3, 4, 5, 6 and 7), where the copper powder content, the insoluble resin powder content and the organic vehicle content were all within the defined ranges, had good properties in that the electroconductive metal in the via-holes was not cracked, that the ceramic substrate itself was not cracked and that the solderability and the platability of the metal in the via-holes were both good. The reasons are that the insoluble resin powder improved the fillability of the paste into the via-holes while retarding the contraction of the electroconductive metal being baked, to thereby inhibit the metal from being cracked, and that it was decomposed and lost in the baking step, thereby not having any negative influence on the solderability and the platability of the metal in the via-holes.

In the embodiment illustrated hereinabove, produced was a ceramic substrate in which the constituent ceramic sheets had via-holes therethrough. However, the invention is not limited to this embodiment. The electroconductive paste of the invention is effectively applicable to not only the formation of via-holes through ceramic substrate but also to the formation of though-holes through the ceramic substrate.

In the illustrated embodiment, used was copper powder as the electroconductive metal powder, which, however, is not limitative. Apart from copper powder, also employable is any noble metals powder such as Pt, Au, Pd, Ag, and even their alloys, and base metals such as Ni and even its alloys.

Needless-to-say, the invention is not whatsoever limited to only the illustrated embodiment. Various applications and modifications can be made within the scope and spirit of the invention for the kind of the ceramics constituting the ceramic substrates, the kind of the binders to be used in preparing the ceramic green sheets, the kind of the insoluble resin powder to be in the paste, and the constitution of the ceramic substrates.

What is claimed is:

1. An electroconductive paste for use in forming via-holes in ceramic substrates, comprising
   from about 80 to 93% by weight of an electroconductive metal powder having a spherical or granular shape and a grain size range between about 0.1 and 50 μm, from about 5 to 18% by weight of an organic vehicle, and from about 2 to 10% by weight of resin powder selected from the group consisting of ethyl cellulose resin and crystalline cellulose resin, having a grain size range between about 0.1 and 50 μm and which is insoluble in the organic vehicle and decomposable upon baking.

2. The electroconductive paste according to claim 1, wherein the electroconductive metal powder is copper powder.

3. An electroconductive paste for use in forming via-holes in ceramic substrates, comprising from about 80 to 93% by weight of an electroconductive metal powder having a spherical or granular shape and a grain size range between about 0.1 and 50 μm, from about 2 to 10% by weight of a crystalline cellulose powder having a grain size range between about 0.1 and 50 μm, and from about 5 to 18% by weight of an organic vehicle.

4. The electroconductive paste according to claim 3, wherein the electroconductive metal powder is copper powder.

5. A ceramic substrate having a via-hole in which an electroconductive paste is present, said electroconductive paste comprising from about 80 to 93% by weight of an electroconductive metal powder having a spherical or granular shape and a grain size range between about 0.1 and 50 μm, from about 5 to 18% by weight of an organic vehicle, and from about 2 to 10% by weight of resin powder selected from the group consisting of ethyl cellulose resin and crystalline cellulose resin, having a grain size range between about 0.1 and 50 μm and which is insoluble in the organic vehicle and decomposable upon baking.

6. The ceramic substrate according to claim 5, wherein the electroconductive metal powder is copper powder.

7. A ceramic substrate having a via-hole in which an electroconductive paste is present, said electroconductive paste comprising from about 80 to 93% by weight of an electroconductive metal powder having a spherical or granular shape and a grain size range between about 0.1 and 50 μm, from about 2 to 10% by weight of a crystalline cellulose powder having a grain size range between about 0.1 and 50 μm, and from about 5 to 18% by weight of an organic vehicle.

8. The ceramic substrate according to claim 7, wherein the electroconductive metal powder is copper powder.

9. A method for producing ceramic substrates, comprising the steps of 1) forming a hole in a ceramic green sheet,
2) filling the hole with an electroconductive paste,
3) laminating a plurality of said ceramic green sheets to produce a laminate, and
4) baking the resulting laminate, wherein the electroconductive paste comprises from about 80 to 93% by weight of an electroconductive metal powder having a spherical or granular shape and a grain size range between about 0.1 and 50 μm, from about 5 to 18% by weight of an organic vehicle, and from about 2 to 10% by weight of resin powder selected from the group consisting of ethyl cellulose resin and crystalline cellulose resin, having a grain size range between about 0.1 and 50 μm and which is insoluble in the organic vehicle and decomposable upon baking.

10. A method according to claim 9, wherein the electroconductive metal powder is copper powder.

11. A method for producing ceramic substrates, comprising the steps of 1) forming a hole in a ceramic green sheet,
2) filling the hole with an electroconductive paste,
3) laminating a plurality of said ceramic green sheets to produce a laminate, and
4) baking the resulting laminate, wherein the electroconductive paste comprises from about 80 to 93% by weight of an electroconductive metal powder having a spherical or granular shape and a grain size range between about 0.1 and 50 μm, from about 2 to 10% by weight of a crystalline cellulose powder having a grain size range between about 0.1 and 50 μm, and from about 5 to 18% by weight of an organic vehicle.

12. A method according to claim 11, wherein the electroconductive metal powder is copper powder.

* * * * *